United States Patent
Jeong et al.

(10) Patent No.: US 9,952,473 B2
(45) Date of Patent: Apr. 24, 2018

(54) DISPLAY PANEL INCLUDING LIGHT SHIELDING LINE, DISPLAY DEVICE HAVING THE SAME AND METHOD OF MANUFACTURING THE SAME

(71) Applicant: SAMSUNG DISPLAY CO., LTD., Yongin-si, Gyeonggi-do (KR)

(72) Inventors: Junki Jeong, Anyang-si (KR); Jisun Kim, Seoul (KR); Meehye Jung, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/581,892

(22) Filed: Apr. 28, 2017

(65) Prior Publication Data

US 2017/0322471 A1    Nov. 9, 2017

(30) Foreign Application Priority Data

May 4, 2016    (KR) .................. 10-2016-0055754

(51) Int. Cl.
| | |
|---|---|
| *H01L 27/14* | (2006.01) |
| *G02F 1/1362* | (2006.01) |
| *G02F 1/1368* | (2006.01) |
| *H01L 27/12* | (2006.01) |
| *G02F 1/1343* | (2006.01) |
| *H01L 27/32* | (2006.01) |
| *H01L 29/786* | (2006.01) |

(52) U.S. Cl.
CPC ...... *G02F 1/136209* (2013.01); *G02F 1/1368* (2013.01); *G02F 1/134309* (2013.01); *G02F 1/136227* (2013.01); *G02F 1/136286* (2013.01); *H01L 27/124* (2013.01); *H01L 27/1225* (2013.01); *G02F 2001/13685* (2013.01); *G02F 2001/136222* (2013.01); *G02F 2001/136295* (2013.01); *G02F 2201/123* (2013.01); *G02F 2202/10* (2013.01); *H01L 27/3272* (2013.01); *H01L 27/3276* (2013.01); *H01L 29/7869* (2013.01)

(58) Field of Classification Search
CPC .................. H01L 27/1225; H01L 27/124
USPC .............................. 257/59, 72, 432
See application file for complete search history.

(56) References Cited

U.S. PATENT DOCUMENTS 7,847,906 B2    12/2010    Tak

FOREIGN PATENT DOCUMENTS

| KR | 1019990066402 A | 8/1999 |
| KR | 1020000075031 A | 12/2000 |

(Continued)

*Primary Examiner* — Tan N Tran
(74) *Attorney, Agent, or Firm* — Cantor Colburn LLP (57) ABSTRACT

A display device including: a display panel which displays an image with light, including: a substrate including: first and second light blocking areas extending in first and second directions, respectively, and a pixel area at which the image is displayed, defined by the first and second light blocking areas which intersect each other; a first shielding line and a data line spaced apart from each other on the substrate at the first light blocking area; a gate line at the second light blocking area to intersect the data line; and a thin film transistor connected to the data and gate lines. The shielding line includes a protrusion protruding toward the data line, the protrusion being overlapped by the thin film transistor. The shielding line is in a same layer of the display panel as the data line among layers disposed on the substrate of the display panel.

17 Claims, 9 Drawing Sheets

(56) References Cited

FOREIGN PATENT DOCUMENTS

| KR | 1020050014414 A | 2/2005 |
|---|---|---|
| KR | 1020070072133 A | 7/2007 |

DISPLAY PANEL INCLUDING LIGHT SHIELDING LINE, DISPLAY DEVICE HAVING THE SAME AND METHOD OF MANUFACTURING THE SAME

This application claims priority to Korean Patent Application No. 10-2016-0055754, filed on May 4, 2016, and all the benefits accruing therefrom under 35 U.S.C. § 119, the content of which in its entirety is herein incorporated by reference.

BACKGROUND

1. Field

Exemplary embodiments of the invention relate to a display device.

2. Description of the Related Art

Display devices may be classified into liquid crystal display ("LCD") devices, organic light emitting diode ("OLED") display devices, plasma display panel ("PDP") devices, electrophoretic display devices, and the like based on a light emitting scheme thereof.

The display device includes a display panel which generates an image. The display panel may include a gate line and a data line, and at least one switching element such as a thin film transistor ("TFT") connected to the gate line and the data line. For the switching element, TFTs using an oxide semiconductor have been developed. The oxide semiconductor TFT has advantages such as relatively high electric field mobility, low threshold voltage, low leakage current and the like, and thus may be applicable to various display devices.

SUMMARY

Exemplary embodiments of the invention are directed to a display device which may be manufactured through a relatively few number of mask processes to have an excellent aperture ratio.

According to an exemplary embodiment of the invention, a display device includes: a display panel which displays an image with light, the display panel including: a substrate including: a first light blocking area lengthwise extending in a first direction, a second light blocking area lengthwise extending in a second direction intersecting the first direction, and a pixel area at which the image is displayed, the pixel area defined by the first light blocking area and the second light blocking area which intersect each other; a first shielding line and a second shielding line spaced apart from each other on the substrate at the first light blocking area; a data line between the first shielding line and the second shielding line at the first light blocking area, the data line spaced apart from the first shielding line and the second shielding line; a gate line disposed on the substrate at the second light blocking area, the gate line intersecting the data line; and a thin film transistor connected to the data line and the gate line. The first shielding line includes a first protrusion protruding toward the second shielding line, and the second shielding line includes a second protrusion protruding toward the first shielding line. The first protrusion or the second protrusion is overlapped by the thin film transistor. The first shielding line and the second shielding line are disposed in a same layer of the display panel as the data line among layers disposed on the substrate of the display panel.

The data line may include at least one bent portion.

The display device may further include: a first insulating layer on the data line and the first and second shielding lines; a semiconductor layer pattern disposed to overlap the data line and the respective first and second protrusion; a second insulating layer on the semiconductor layer pattern; a gate electrode on the second insulating layer; a third insulating layer on the first insulating layer, the semiconductor layer pattern and the gate electrode; a color filter on the third insulating layer; a fourth insulating layer on the color filter; a pixel electrode on the fourth insulating layer at the pixel area; and a first bridge electrode on the fourth insulating layer at the first light blocking area.

The semiconductor layer pattern may include at least one selected from zinc oxide ("Z"), zinc-tin oxide ("ZTO"), zinc-indium oxide ("ZIO"), indium oxide (I), titanium oxide (TiO), indium-gallium-zinc oxide ("IGZO") and indium-zinc-tin oxide ("IZTO").

The first bridge electrode may be disposed in a same layer as the pixel electrode.

The first bridge electrode may be connected to the data line through the first insulating layer, the third insulating layer, the color filter and the fourth insulating layer, and may be connected to the semiconductor layer pattern through the third insulating layer, the color filter and the fourth insulating layer.

The pixel electrode may be connected to the semiconductor layer pattern through the third insulating layer, the color filter and the fourth insulating layer.

The display device may further include an auxiliary pattern on the substrate, the auxiliary pattern overlapped by the gate electrode.

The auxiliary pattern may be disposed in a same layer as the first and second shielding lines and the data line.

The display device may further include a second bridge electrode disposed on the fourth insulating layer at the first light blocking area and overlapping at least a portion of the auxiliary pattern.

The second bridge electrode may be disposed in a same layer as the first bridge electrode and the pixel electrode.

The second bridge electrode may be connected to the gate electrode through the third insulating layer, the color filter and the fourth insulating layer, and may be connected to the auxiliary pattern through the first insulating layer, the third insulating layer, the color filter and the fourth insulating layer.

The display device may further include a black matrix at the first light blocking area and the second light blocking area.

A length of the pixel electrode in the second direction may be larger than a width of the pixel electrode in the first direction.

The foregoing is illustrative only and is not intended to be in any way limiting. In addition to the illustrative embodiments, and features described above, further embodiments, and features will become apparent by reference to the drawings and the following detailed description.

BRIEF DESCRIPTION OF THE DRAWINGS

The above and other features of the present disclosure of invention will be more clearly understood from the following detailed description taken in conjunction with the accompanying drawings, in which.

DETAILED DESCRIPTION

Advantages and features of the invention and methods for achieving them will be made clear from exemplary embodiments described below in detail with reference to the accompanying drawings. The invention may, however, be embodied in many different forms and should not be construed as being limited to the exemplary embodiments set forth herein. Rather, these exemplary embodiments are provided so that this disclosure will be thorough and complete, and will fully convey the scope of the invention to those skilled in the art. The invention is merely defined by the scope of the claims. Accordingly, well-known constituent elements, operations and techniques are not described in detail in the exemplary embodiments in order to prevent the invention from being obscurely interpreted. Like reference numerals refer to like elements throughout the specification.

In the drawings, thicknesses of a plurality of layers and areas are illustrated in an enlarged manner for clarity and ease of description thereof. When a layer, area, or plate is referred to as being related to another layer such as being "on" another layer, area, or plate, it may be directly on the other layer, area, or plate, or intervening layers, areas, or plates may be present therebetween. Conversely, when a layer, area, or plate is referred to as being related to another layer such as being "directly on" another layer, area, or plate, intervening layers, areas, or plates may be absent therebetween. Further when a layer, area, or plate is referred to as being related to another layer such as being "below" another layer, area, or plate, it may be directly below the other layer, area, or plate, or intervening layers, areas, or plates may be present therebetween. Conversely, when a layer, area, or plate is referred to as being related to another layer such as being "directly below" another layer, area, or plate, intervening layers, areas, or plates may be absent therebetween.

The spatially relative terms "below," "beneath," "less," "above," "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed similarly without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to specifically describe embodiments according to an exemplary embodiment, and like reference numerals refer to like elements throughout the specification.

An oxide semiconductor TFT within a display panel of a display device may be classified into a top gate type and a bottom gate type depending on the position of a gate electrode relative to other layers within the oxide semiconductor TFT. The oxide semiconductor TFT of a top gate type may be manufactured at a relatively low process temperature without a process such as laser crystallization or doping and/or activation, and is excellent in stability.

Hereinafter, display devices according to one or more exemplary embodiments will be described on the premise that they are a liquid crystal display ("LCD") device. However, the scope of the invention is not limited to the LCD device, and the invention may be applicable to organic light emitting diode ("OLED") display devices, for example.

A display device may include a display panel which generates an image displayed by the display device. The display device and/or the display panel may include a display area at which the image is displayed, and a non-display area at which the image is not displayed.

Figure 1:
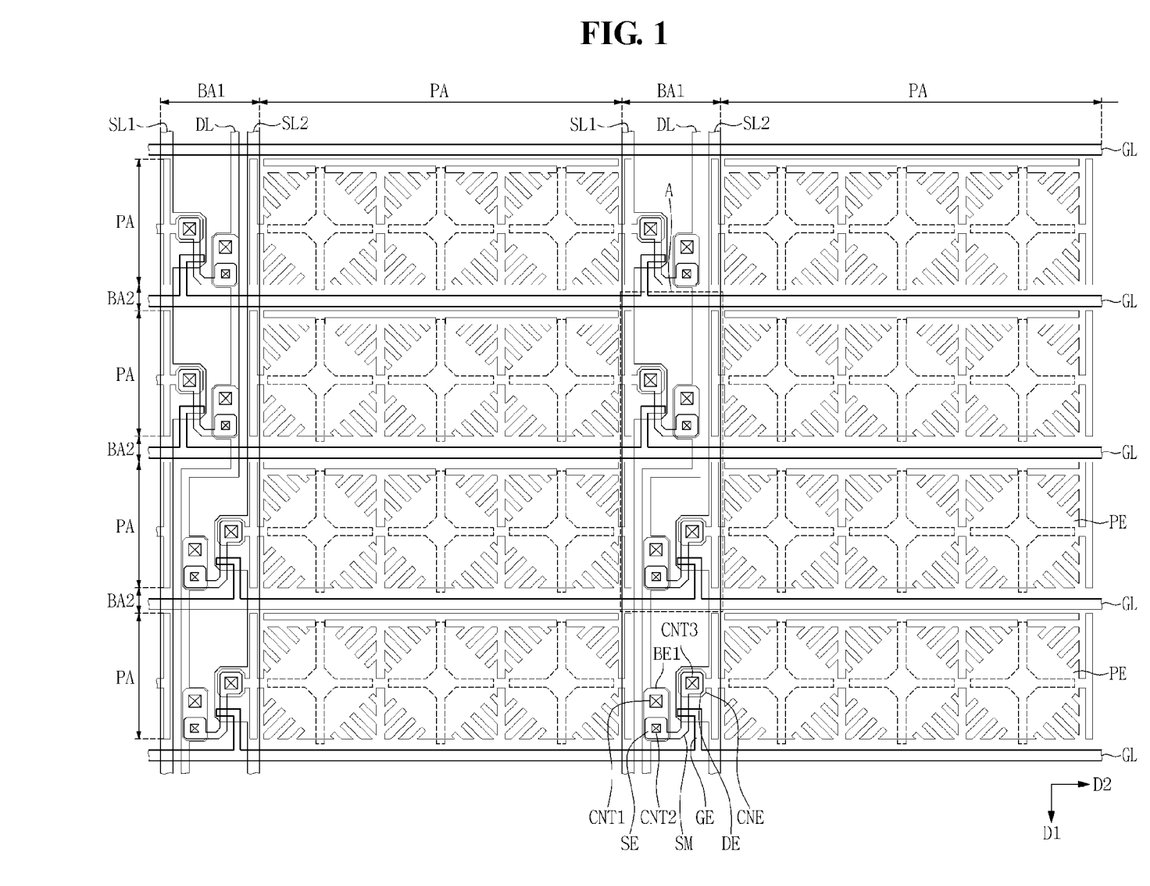
FIG. 1 is a top plan view illustrating an exemplary embodiment of a portion of a display panel of a display device, according to the invention.
Figure 2:
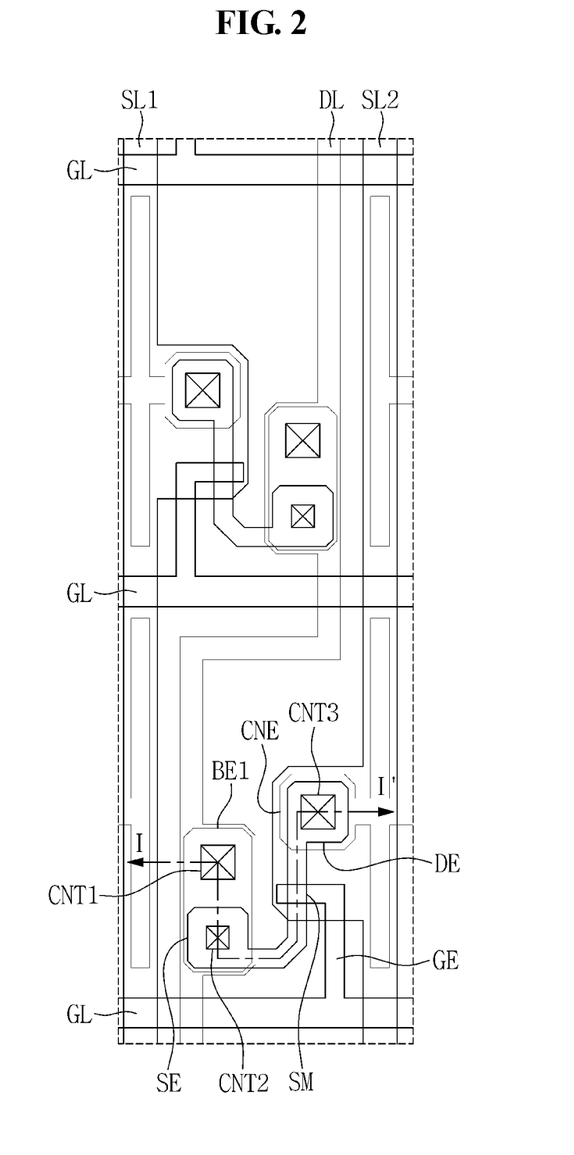
FIG. 2 is an enlarged top plan view illustrating area A of FIG. 1.
Figure 3:
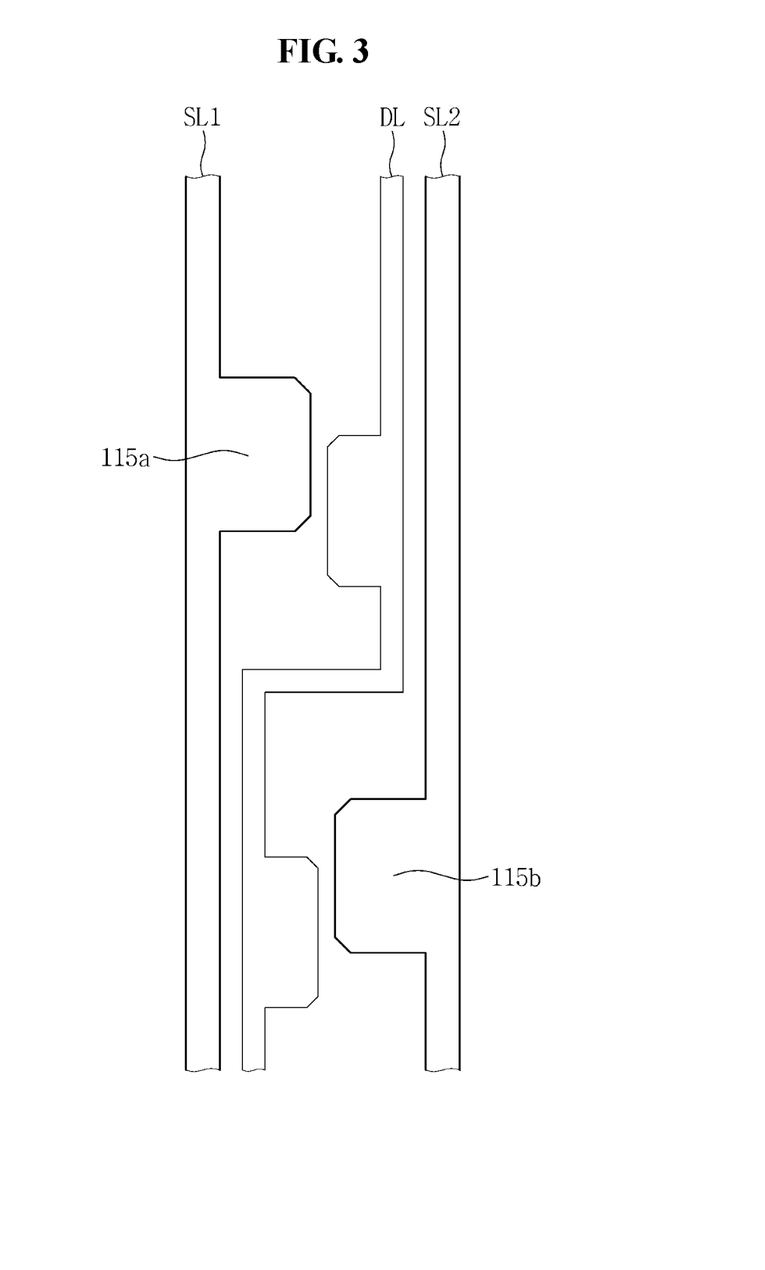
FIG. 3 is a top plan view illustrating an exemplary embodiment of a shielding line and a data line in the area A of FIG. 1.
Figure 4:
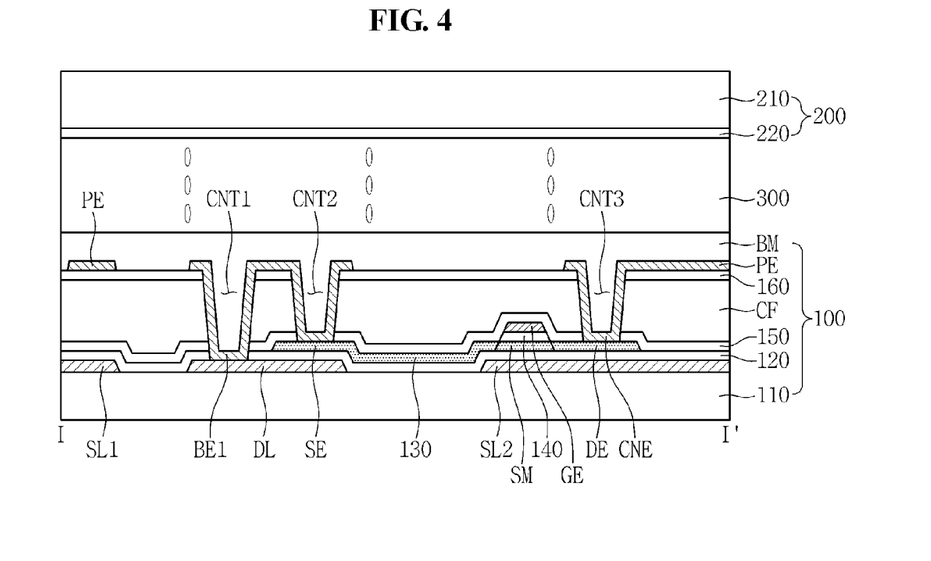
FIG. 4 is a cross-sectional view taken along line I-I' of FIGS. 2.

FIG. 1 is a top plan view illustrating an exemplary embodiment of a portion of a display panel of a display device according to the invention, FIG. 2 is an enlarged top plan view illustrating area A of FIG. 1, FIG. 3 is a top plan view illustrating an exemplary embodiment of a shielding line and a data line in the area A of FIG. 1, and FIG. 4 is a cross-sectional view taken along line I-I' of FIG. 2.

Referring to FIGS. 1, 2, 3 and 4, a display device according to an exemplary embodiment includes a lower panel 100, an upper panel 200 and an optical control layer such as a liquid crystal layer 300 between the lower panel 100 and the upper panel 200. The elements of the lower panel 100, the upper panel 200 and the optical control layer therebetween may constitute a display panel of the display device. In addition, the display device according to an exemplary embodiment may further include a backlight unit (not shown) that generates and outputs light toward the lower panel 100, but the invention is not limited thereto. The optical control layer control transmittance of the light from the backlight unit to display the image.

The lower panel 100 includes a lower substrate 110, first and second shielding lines SL1 and SL2, a data line DL, a first insulating layer 120, a semiconductor layer pattern 130, a second insulating layer 140, a gate wiring GL and GE, a third insulating layer 150, a color filter CF, a fourth insulating layer 160, a pixel electrode PE, a first bridge electrode BE1 and a black matrix BM. One or more of these elements of the lower panel 100 may be provided in plurality within the lower panel 100. The views of FIGS. 1, 2, 3 and 4 may illustrate pixels in a display area of the display device and/or display panel, at which the image is generated and/or displayed. Referring to FIG. 1, a length of the pixel electrode PE in the second direction D2 may be larger than a width of the pixel electrode in the first direction D1.

The lower substrate 110 may be an insulating substrate having light transmitting characteristics and/or flexible characteristics, like a plastic substrate. However, exemplary embodiments are not limited thereto, and the lower substrate 110 may include a relatively hard substrate such as a glass substrate.

The lower substrate 110 includes a first light blocking area BA1 having a length thereof extending in a first direction D1, a second light blocking area BA2 having a length thereof extending in a second direction D2 that intersects the first direction D1, and a pixel area PA defined or bounded by the first light blocking area BA1 and the second light blocking area BA2 which lengthwise extend to intersect each other. The light blocking and pixel areas BA1, BA2 and PA may collectively form the pixels. The pixel area PA may be a display area of the pixels, and the light blocking areas BA1 and BA2 may be a non-display area of the pixels.

FIG. 3 illustrates structures of the first shielding line SL1, the second shielding line SL2 and the data line DL relative to each other, and additional elements of the lower panel 100 are omitted for convenience of explanation. As illustrated in FIG. 3, the first shielding line SL1, the second shielding line SL2 and the data line DL are disposed on the lower substrate 110 at the first light blocking area BA1. Each of the first shielding line SL1, the second shielding line SL2 and the data line DL have a length which extends in the first direction D1. Widths of elements are smaller then the lengths thereof, and are taken in a direction normal to such lengths.

The first and second shielding lines SL1 and SL2 may overlap a portion of the semiconductor layer pattern 130, to be described below, to block a portion of light propagating into the semiconductor layer pattern 130 from the lower substrate 110, such as from the backlight unit which provides light to the lower substrate 110. That is, the first and second shielding lines SL1 and SL2 are disposed before the semiconductor layer patter 130 in a light traveling direction to block light from propagating into the portion of the semiconductor layer pattern 130.

The first and second shielding lines SL1 and SL2 may receive a ground voltage or a storage voltage from an external source (not shown) which is disposed outside the display panel and/or the display device. In addition, the first and second shielding lines SL1 and SL2 may be electrically floated without receiving a voltage from the outside.

The first and second shielding lines SL1 and SL2 respectively include or define first and second protrusions 115a and 115b protruding toward the inside of the first light blocking area BA1 from an outer boundary thereof. In an exemplary embodiment, for example, within the first light blocking area BA1, the first shielding line SL1 includes the first protrusion 115a protruding toward the second shielding line SL2, and the second shielding line SL2 includes the second protrusion 115b protruding toward the first shielding line SL1. The first and second protrusions 115a and 115b overlap a portion of the semiconductor layer pattern 130 to be described below.

Within the first light blocking area BA1, the data line DL includes at least one bent portion along a length thereof, and is spaced apart from the first and second shielding lines SL1 and SL2. The data line DL may have a shape bent at regular intervals along the length thereof, but the invention is not limited thereto.

In an exemplary embodiment, for example, the data line DL arranged along a column direction (the first direction D1) may be bent at intervals of three pixel rows.

That is, thin film transistors ("TFTs") connected to pixels arranged in parallel along the column direction (the first direction D1) may be alternately connected to different data lines DL at intervals of three pixel rows. In such an exemplary embodiment, voltages of opposite polarities may be respectively applied to two adjacent data lines DL. Accordingly, a difference in luminance due to a kickback voltage of a pixel voltage applied with a data voltage is dispersed, and flickering may be substantially prevented.

Referring to FIG. 1, for example, the data line DL is provided in plurality lengthwise extended along a column direction (the first direction D1) and is bent at a position between two pixel rows. The data lines DL are arranged in the second direction D2. The thin film transistors ("TFTs") connected to pixels arranged in parallel along the column direction (the first direction D1) are alternately connected to different data lines DL at intervals of two pixel rows. In such an exemplary embodiment, voltages of opposite polarities may be respectively applied to the two adjacent data lines DL in FIG. 1.

In an exemplary embodiment of manufacturing the display panel and/or the display device, the data line DL may be formed simultaneously with the first and second shielding lines SL1 and SL2 in a substantially same process. That is, the data line DL and the first and second shielding lines SL1 and SL2 may be in a same layer of the lower panel 100 among layers disposed on the lower substrate 110 to be formed from a same material layer and each include the same material.

The first and second shielding lines SL1 and SL2 and the data line DL may include a material capable of absorbing and/or blocking light, and may otherwise be referred to as a light shielding line. The first and second shielding lines SL1 and SL2 and the data line DL may include or be formed of at least one selected from aluminum (Al) or alloys thereof, silver (Ag) or alloys thereof, copper (Cu) or alloys thereof, molybdenum (Mo) or alloys thereof, chromium (Cr), tantalum (Ta) and titanium (Ti).

As illustrated in FIG. 4, the first insulating layer 120 is disposed on the lower substrate 110 including the first and second shielding lines SL1 and SL2 and the data lines DL thereon. The first insulating layer 120 may be referred to as a buffer layer. The first insulating layer 120 may include silicon oxide (SiOx) or silicon nitride (SiNx). In addition, the first insulating layer 120 may further include aluminum oxide, titanium oxide, tantalum oxide or zirconium oxide.

A semiconductor layer (or pattern) SM, a source electrode SE and a drain electrode DE of a thin film transistor ("TFTs") are each disposed on the first insulating layer 120. The semiconductor layer SM, the source electrode SE and the drain electrode DE may each include an oxide semiconductor material. Accordingly, in the exemplary embodiment, the semiconductor layer SM, the source electrode SE and the drain electrode DE are collectively referred to as the semiconductor layer pattern 130. The semiconductor layer pattern 130 is disposed so as to overlap the first and second shielding lines SL1 and SL2. More particularly, portions of the source electrode SE, the drain electrode DE and the semiconductor layer SM overlap the first and second shielding lines SL1 and SL2.

In an exemplary embodiment, for example, the semiconductor layer pattern 130 may include an oxide semiconductor material. The oxide semiconductor material is a metal oxide semiconductor and may include a metal oxide such as zinc (Zn), indium (In), gallium (Ga), tin (Sn) and titanium (Ti), or a compound of a metal, such as zinc (Zn), indium (In), gallium (Ga), tin (Sn) and titanium (Ti), and an oxide thereof. In an exemplary embodiment, for example, the oxide semiconductor material may include at least one selected from zinc oxide (Z), zinc-tin oxide (ZTO), zinc-indium oxide (ZIO), indium oxide (I), titanium oxide (TiO), indium-gallium-zinc oxide (IGZO) and indium-zinc-tin oxide (IZTO).

The semiconductor layer pattern 130 is divided into the source electrode SE, the semiconductor layer SM and the drain electrode DE depending on whether an impurity is implanted to locations of an initial material layer of the semiconductor layer pattern 130. A portion of the initial material layer for forming the semiconductor layer pattern 130 where the impurity is not implanted becomes the semiconductor layer SM, such as by being overlapped with the gate electrode GE and the second insulating layer 140 in a process of manufacturing the display panel and/or the display device. Another portion of the initial material layer for forming the semiconductor layer pattern 130 into which the impurity is implanted is metallized, thus becoming the source electrode SE and the drain electrode DE. In manufacturing the display panel and/or the display device, the impurity may be implanted into an initial oxide semiconductor material layer in a plasma scheme.

The second insulating layer 140 is disposed on the lower substrate 110 including the semiconductor layer pattern 130 thereon, e.g., the semiconductor layer SM, the source electrode SE and the drain electrode DE. The second insulating layer 140 may include silicon oxide (SiOx) or silicon nitride (SiNx), and may be referred to as a gate insulating layer.

The gate wiring GL and GE which includes a gate line GL having a length extending in the second direction D2 and a gate electrode GE branching off from the gate line GL and overlapping the semiconductor layer SM, is disposed on the second insulating layer 140.

The gate wiring GL and GE may include or be formed of aluminum (Al) or alloys thereof, silver (Ag) or alloys thereof, copper (Cu) or alloys thereof, molybdenum (Mo) or alloys thereof, chromium (Cr), tantalum (Ta) and titanium (Ti).

In addition, the gate wiring GL and GE may have a multilayer structure including two or more conductive layers (not illustrated) having different physical properties from each other. In an exemplary embodiment, for example, a conductive layer of the multilayer structure may include or be formed of a metal having relatively low resistivity to reduce signal delay or voltage drop, e.g., an aluminum (Al)-based metal, a silver (Ag)-based metal and a copper (Cu)-based metal, and another conductive layer of the multilayer structure may include a material that is found to impart excellent contact properties with indium tin oxide ("ITO") and indium zinc oxide ("IZO"), e.g., a molybdenum-based metal, chromium, titanium, tantalum, and the like.

Examples of the multilayer structure may include a chromium lower layer and an aluminum upper layer, an aluminum lower layer and a molybdenum upper layer, and a titanium lower layer and a copper upper layer. However, exemplary embodiments are not limited thereto, and the gate wiring GL and GE may include various kinds of materials such as metals and conductors. In an exemplary embodiment of manufacturing the display panel and/or the display device, the gate wiring GL and GE may be simultaneously formed in a substantially same process. That is, the gate wiring GL and GE may be in a same layer of the lower panel 100 among layers disposed on the lower substrate 110 to be formed from a same material layer and each include the same material.

The third insulating layer 150 is disposed on the lower substrate 110 including the gate wiring GL and GE thereon. The third insulating layer 150 may also be referred to as an insulating interlayer. The third insulating layer 150 may include silicon oxide (SiOx) or silicon nitride (SiNx).

The color filter CF is disposed on the third insulating layer 150. In a top plan view, the color filter CF may be arranged in a line shape to have a length thereof extended along the second direction D2 in the pixel area PA and in the first light blocking area BA1. However, exemplary embodiments are not limited thereto, and the color filter CF may be arranged in the form of an island shape within each pixel area PA. In addition, the color filter CF may be disposed to extend to a portion of the second light blocking area BA2 adjacent to or defining a boundary of the pixel area PA. Adjacent ones of the color filters CF may overlap each other or may be spaced from each other.

The color filter CF may have a color of red, green, blue, cyan, magenta, yellow or white. Three primary colors of red, green and blue, or cyan, magenta and yellow may define or be disposed in a basic pixel group for forming a color in displaying the image.

The fourth insulating layer 160 is disposed on the lower substrate 110 including the color filter CF is disposed thereon. The fourth insulating layer 160 may have a monolayer structure or a multilayer structure including, for example, silicon oxide, silicon nitride, a photosensitive organic material, or a relatively low dielectric constant insulating material such as a-Si:C:O or a-Si:O:F.

The pixel electrode PE is disposed on the fourth insulating layer 160 at the pixel area PA. The pixel electrode PE according to an exemplary embodiment is described on the premise as including a cross-shaped stem portion and a plurality of branch portions which extend from the cross-shaped stem portion, but exemplary embodiments are not limited thereto. That is, the shape of the pixel electrode PE is not particularly limited.

The pixel electrode PE may further include or define a connection electrode CNE branching from a branch portion of the pixel electrode PE toward the first light blocking area BA1. The connection electrode CNE may pass through the third insulation layer 150, the color filter CF and the fourth insulating layer 160 to connect the pixel electrode PE and the drain electrode DE of the thin film transistor ("TFT") to each other.

The first bridge electrode BE1 is disposed on the fourth insulating layer 160 at the first light blocking area BA1. The first bridge electrode BE1 passes through the first insulating layer 120, the third insulating layer 150, the color filter CF and the fourth insulating layer 160 to connect the data line DL and the source electrode SE to each other.

The pixel electrode PE, the connection electrode CNE and the first bridge electrode BE1 may each include a transparent conductive material. In an exemplary embodiment, for example, the pixel electrode PE, the connection electrode CNE and the first bridge electrode BE1 may include a transparent conductive material such as indium tin oxide ("ITO"), indium zinc oxide ("IZO"), indium tin zinc oxide ("ITZO"), aluminum zinc oxide ("AZO"), or the like.

In an exemplary embodiment of manufacturing the display panel and/or the display device, the pixel electrode PE, the connection electrode CNE and the first bridge electrode BE1 may be simultaneously formed in a substantially same process. That is, the pixel electrode PE, the connection electrode CNE and the first bridge electrode BE1 may be in a same layer of the lower panel 100 among layers disposed on the lower substrate 110 to be formed from a same material layer and each include the same material.

The black matrix BM is disposed on the lower substrate 110 including the pixel electrode PE, the connection electrode CNE and the first bridge electrode BE1 thereon.

The black matrix BM is disposed at the first light blocking area BA1, to have a length extending in the first direction D1. Further, although not illustrated, the black matrix BM may be further disposed at the second light blocking area BA2, to have a length extending in the second direction D2.

The black matrix BM may include or be formed of a photosensitive composition. Examples of the photosensitive composition may include: a binder resin, a polymerizable monomer, a polymerizable oligomer, a pigment, a dispersant and a photoinitiator. The pigment may use a black pigment, a black resin, or the like.

A lower alignment layer (not illustrated) may be disposed on the pixel electrode PE and the black matrix BM, adjacent to the liquid crystal layer 300. The lower alignment layer may be a homeotropic alignment layer or a photoalignment layer including a photopolymerizable material.

The upper panel 200 includes an upper substrate 210 and a common electrode 220.

The upper substrate 210 may be an insulating substrate having light transmitting characteristics and flexible characteristics, like a plastic substrate. However, exemplary embodiments are not limited thereto, and the upper substrate 210 may include a relatively hard substrate such as a glass substrate.

The common electrode 220 may be a whole plate electrode (e.g., no slits or openings except for connection areas) including a transparent conductor such as indium tin oxide ("ITO") or indium zinc oxide ("IZO"). In an alternative exemplary embodiment, and the common electrode 220 may include a concave-convex shape and at least one slit for defining a plurality of domains.

An upper alignment layer (not illustrated) may be disposed on the common electrode 220, adjacent to the liquid crystal layer 300. The upper alignment layer (not illustrated) may be a homeotropic alignment layer or a photoalignment layer including a photopolymerizable material.

FIGS. 5A, 5B, 5C, 5D, 5E and 5F are cross-sectional views illustrating an exemplary embodiment of a process of manufacturing a display panel of a display device according to an exemplary embodiment, which correspond to the cross-sectional view taken along line I-I' of FIG. 2.

Figure 5A:
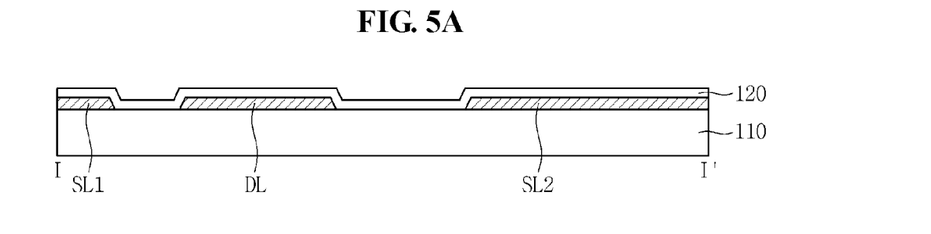
FIGS. 5A, 5B, 5C, 5D, 5E and 5F are cross-sectional views illustrating an exemplary embodiment of a process of manufacturing a display panel of a display device according to the invention.

Referring to FIG. 5A, a material layer having conductivity and capable of absorbing and/or blocking light is applied on the lower substrate 110, and the material layer is patterned to form the data line DL and the first and second shielding lines SL1 and SL2.

The data line DL and the first and second shielding lines SL1 and SL2 may include or be formed of, for example, at least one selected from aluminum (Al) or alloys thereof, silver (Ag) or alloys thereof, copper (Cu) or alloys thereof, molybdenum (Mo) or alloys thereof, chromium (Cr), tantalum (Ta) and titanium (Ti).

In an exemplary embodiment of manufacturing the display panel and/or the display device, the data line DL and the first and second shielding lines SL1 and SL2 are simultaneously formed in a substantially same process. A first insulating material layer (indicated at 120) is disposed over an entire surface of the lower substrate 110 including the data line DL and the first and second shielding lines SL1 and SL2 thereon.

Figure 5B:
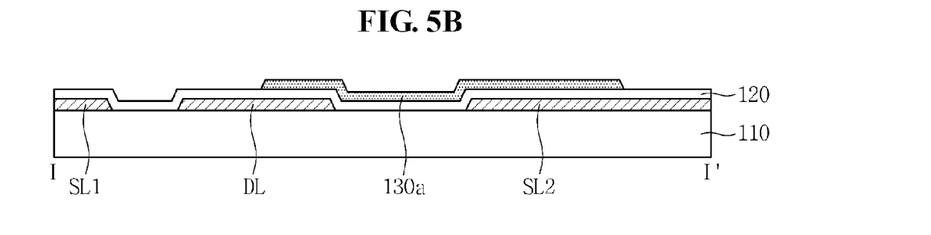

Referring to FIG. 5B, an oxide semiconductor material layer 130a is disposed on the first insulating layer 120. The oxide semiconductor material layer 130a may be disposed so as to overlap at least a portion of the first and second shielding lines SL1 and SL2. The oxide semiconductor material layer 130a may include at least one selected from zinc oxide (Z), zinc-tin oxide ("ZTO"), zinc-indium oxide ("ZIO"), indium oxide (InO), titanium oxide (TiO), indium-gallium-zinc oxide ("IGZO") and indium-zinc-tin oxide ("IZTO").

A second insulating material layer (indicated at 140) is disposed over an entire surface of the lower substrate 110 on which the oxide semiconductor material 130a is disposed.

Figure 5C:
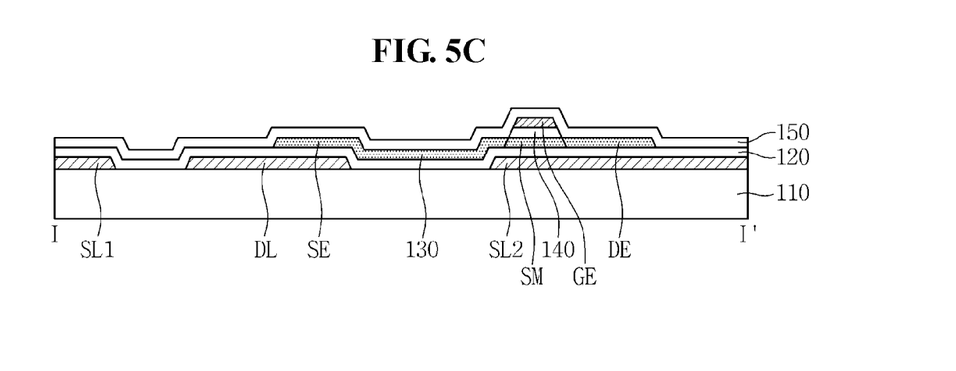

Referring to FIG. 5C, a metal material layer is disposed on the second insulating material layer, such as on an entire surface thereof, and the metal material layer and the second insulating material layer are patterned to form the gate wiring GL and GE including the gate line GL and the gate electrodes GE, and the second insulating layer 140 overlapping the gate wiring GL and GE, respectively.

Subsequently, an impurity is implanted into the oxide semiconductor material layer 130a in a selective manner to form the source electrode SE and the drain electrode DE. A portion of the oxide semiconductor material layer 130a where the impurity is not selectively implanted becomes the semiconductor layer SM. The source electrode SE, the drain electrode DE and the semiconductor layer SM collectively form the semiconductor layer pattern 130

In addition, the second insulating layer 140 according to an exemplary embodiment is depicted as being disposed only below the gate wiring GL and GE, but exemplary embodiments are not limited thereto. The second insulating layer 140 may be disposed over an entire surface of the lower substrate 110, that is, the second insulating material layer described above may remain un-patterned.

A third insulating material layer (indicated at 150 in FIG. 5C) is formed over an entire surface of the lower substrate 110 including the gate wiring GL and GE thereon.

Figure 5D:
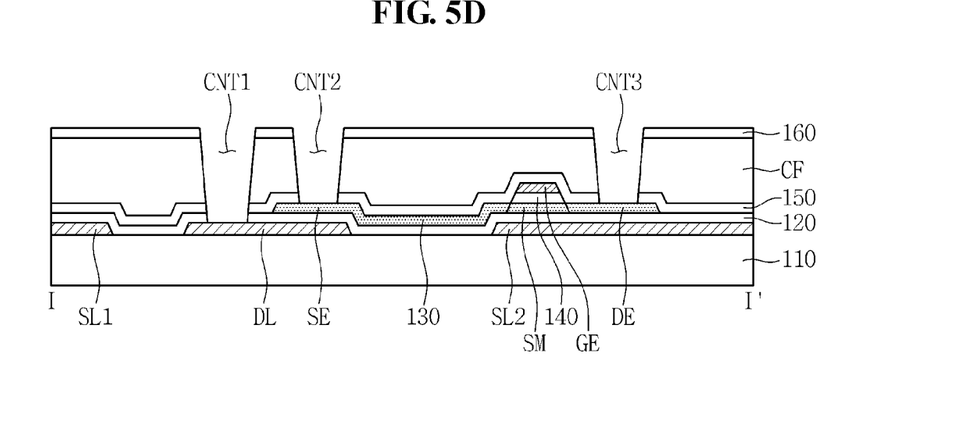

Referring to FIG. 5D, a color filter material layer (indicated at CF) is disposed on the third insulating material layer. The color filter material layer may be formed, lengthwise extending within the pixel area PA and further extending to a portion of the first and second light blocking areas BA1 and BA2 which are adjacent to the pixel area PA.

A fourth insulating material layer (indicated at 160) is disposed over an entire surface of the lower substrate 110 including the color filter material layer thereon.

Subsequently, the fourth insulating material layer, the color filter material layer, the third insulating material layer and the first insulating material layer are respectively patterned using a single mask. For example, the fourth insulating material layer, the color filter material layer, the third insulating material layer and the first insulating material layer on the data line DL are sequentially etched to expose a portion of the data line DL. Similarly, the fourth insulating material layer, the color filter material layer and the third insulating material layer on the source electrode SE and the drain electrode DE are sequentially etched to expose a portion of the source electrode SE and the drain electrode DE.

Accordingly, each of a first contact hole CNT1 exposing the data line DL and second and third contact holes CNT2 and CNT3 exposing the source electrode SE and the drain electrode DE is defined by such etching. That is, the forming of the contact holes CNT1, CNT2 and CNT3 forms the fourth insulating layer 160, the color filter CF, the third insulating layer 150 and the first insulating layer 120 which are patterned using the single mask.

However, exemplary embodiments are not limited thereto. In an exemplary embodiment, after the first, second and third contact holes CNT1, CNT2 and CNT3 are defined in the color filter material layer, the third insulating material layer and the first insulating material layer, the fourth insulating material layer (indicated at 160) is disposed thereon such as being disposed within such contact holes. Then the fourth insulating material layer may be etched such that the first, second and third contact holes CNT1, CNT2 and CNT3 may be defined therein.

Figure 5E:
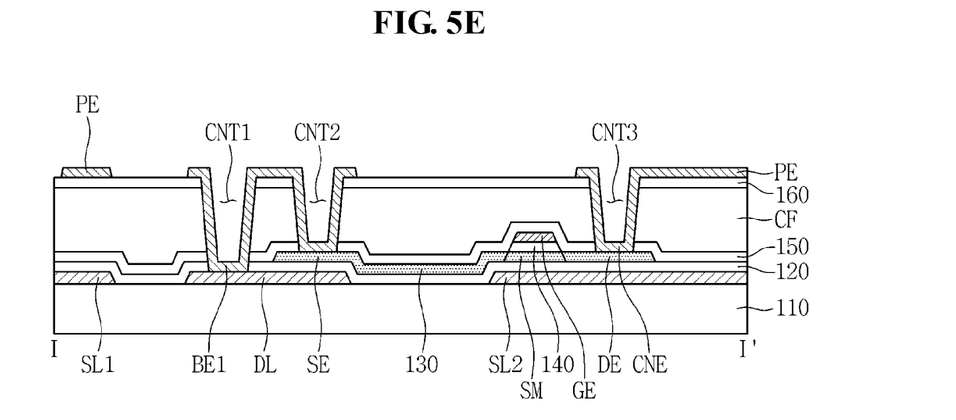

Referring to FIG. 5E, a pixel electrode material layer (indicated at PE) is formed on the fourth insulating layer 160 at the pixel area PA, and the first bridge electrode BE1 and the connection electrode CNE which extends from the pixel electrode PE are each formed on the fourth insulating layer 160 at the first light blocking area BA1.

The first bridge electrode BE1 is connected to the data line DL at and through the first contact hole CNT1 and is connected to the source electrode SE at and through the second contact hole CNT2.

The connection electrode CNE is connected to the drain electrode DE at and through the third contact hole CNT3.

In an exemplary embodiment of manufacturing the display panel and/or the display device, the pixel electrode PE, the connection electrode CNE and the first bridge electrode BE1 may be simultaneously formed in a substantially same process. That is, the pixel electrode PE, the connection electrode CNE and the first bridge electrode BE1 may be in a same layer of the lower panel 100 among layers disposed on the lower substrate 110 to be formed from a same material layer and each include the same material.

Figure 5F:
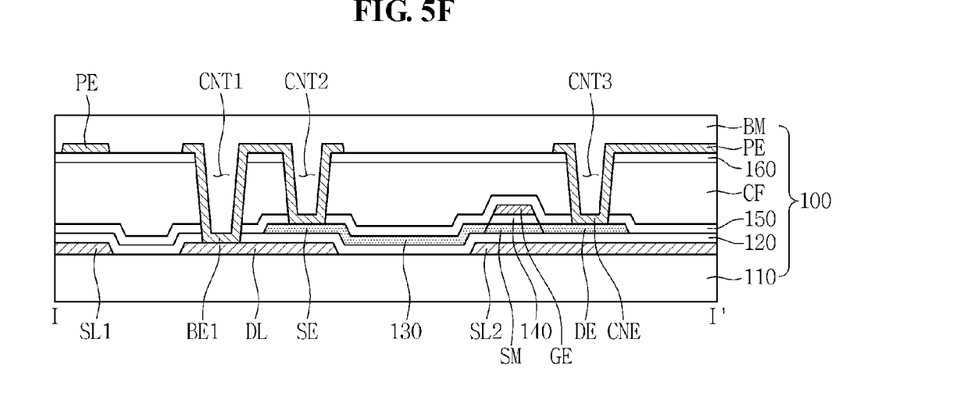

Referring to FIG. 5F, the black matrix BM is formed on the lower substrate 110 at the first and second light blocking areas BA1 and BA2 including the pixel electrode PE, the connection electrode CNE and the first bridge electrode BE1 thereon.

Although the black matrix BM according to an exemplary embodiment is depicted as being included in the lower panel 100, exemplary embodiments are not limited thereto. In an exemplary embodiment, the black matrix BM may be disposed within the upper panel 200 on the upper substrate 210 thereof, at the first and second light blocking areas BA1 and BA2.

Since the data line DL and the first and second shielding lines SL1 and SL2 are disposed in a substantially same layer of the display panel, the display device according an exemplary embodiment may be manufactured through a relatively few number of mask processes, and a decrease of an aperture ratio of the display device may be substantially prevented.

Hereinafter, another exemplary embodiment of a display panel of a display device according to the invention will be described with reference to FIGS. 6, 7, 8 and 9. The descriptions of the same configuration as those of the previously described exemplary embodiments will be omitted for convenience of explanation.

Figure 6:
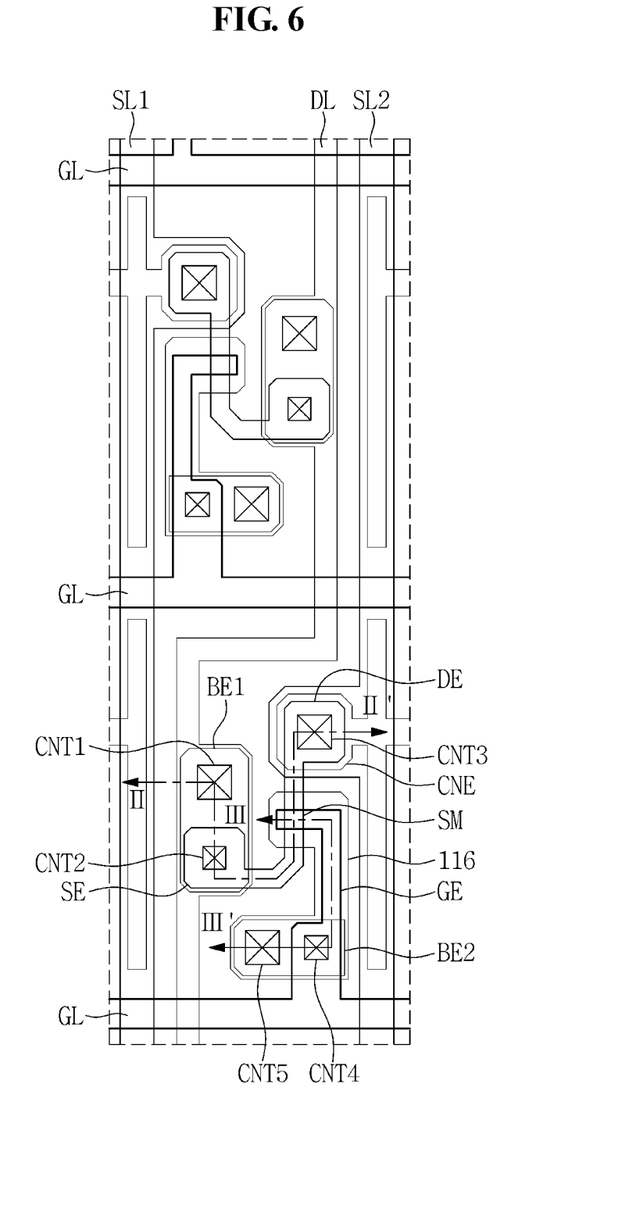
FIG. 6 is an enlarged top plan view illustrating another exemplary embodiment of a display panel of a display device, corresponding to the area A of FIG. 1, according to the invention.
Figure 7:
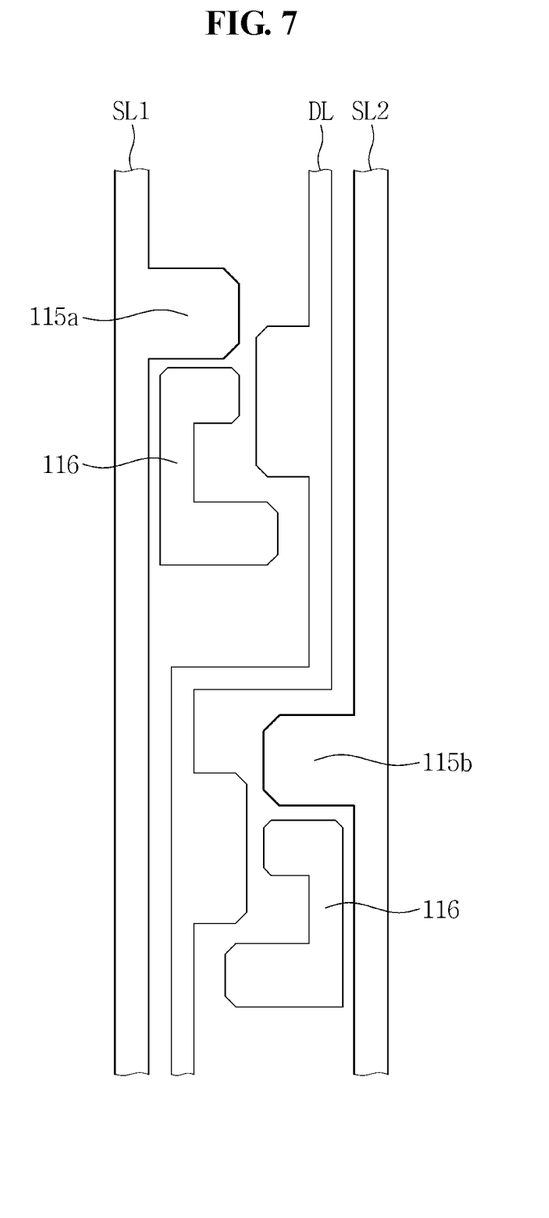
FIG. 7 is a top plan view illustrating an exemplary embodiment of a shielding line and a data line of FIG. 6.
Figure 8:
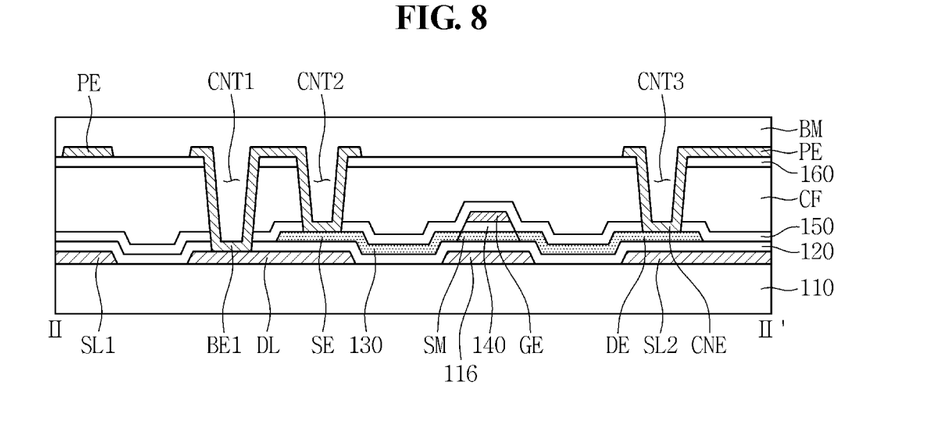
FIG. 8 is a cross-sectional view taken along line II-II' of FIG. 6.
Figure 9:
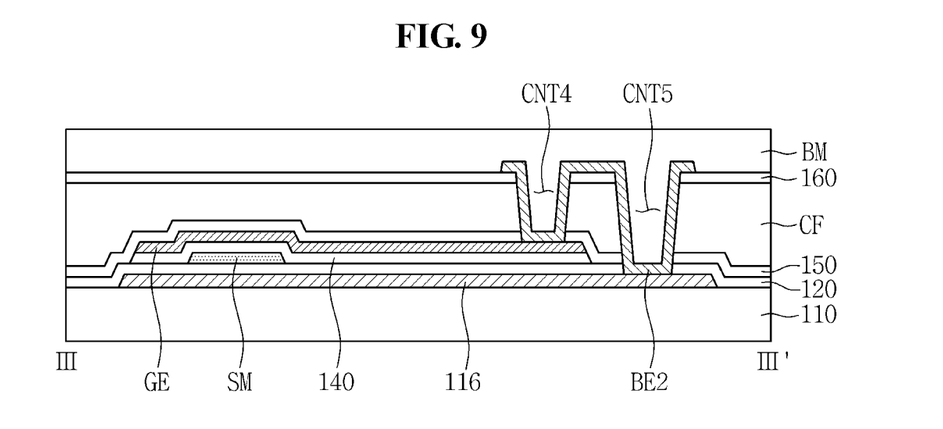
FIG. 9 is a cross-sectional view taken along line III-III' of FIG. 6.

FIG. 6 is an enlarged top plan view illustrating a portion of a display panel of a display device, corresponding to the area A of FIG. 1, according to the invention, FIG. 7 is a top plan view illustrating an exemplary embodiment of a shielding line and a data line of FIG. 6, FIG. 8 is a cross-sectional view taken along line II-II'of FIG. 6, and FIG. 9 is a cross-sectional view taken along line III-III' of FIG. 6.

Referring to FIGS. 6, 7, 8 and 9, the display device according to an alternative exemplary embodiment further includes an auxiliary pattern 116 and a second bridge electrode BE2 overlapping a gate electrode GE.

As illustrated in FIGS. 6 and 7, a first shielding line SL1, a second shielding line SL2, a data line DL and the auxiliary pattern 116 are disposed on the lower substrate 110 at a first light blocking area BA1 (refer to FIG. 1).

The first and second shielding lines SL1 and SL2 may externally receive a ground voltage or a storage voltage. In addition, the first and second shielding lines SL1 and SL2 may be electrically floated without receiving a voltage from the outside.

The auxiliary pattern 116 is connected to the gate electrode GE and receives a gate voltage therefrom.

The auxiliary pattern 116 is disposed spaced apart from the first shielding line SL1 and the data line DL which is between the first shielding line SL1 and the data line DL. In addition, the auxiliary pattern 116 is disposed spaced apart from the second shielding line SL2 and the data line DL which is between the second shielding line SL2 and the data line DL.

In an exemplary embodiment of manufacturing the display panel and/or the display device, the first shielding line SL1, the second shielding line SL2, the data line DL and the auxiliary pattern 116 may be formed simultaneously in a substantially same process. That is, the data line DL, the first and second shielding lines SL1 and SL2 and the auxiliary pattern 116 may be in a same layer of the lower panel 100 among layers disposed on the lower substrate 110 to be formed from a same material layer and each include the same material.

The first shielding line SL1, the second shielding line SL2, the data line DL and the auxiliary pattern 116 may include a material having conductivity and capable of absorbing and/or blocking light. In an exemplary embodiment, for example, the first shielding line SL1, the second shielding line SL2, the data line DL and the auxiliary pattern 116 may include or be formed of at least one selected from aluminum (Al) or alloys thereof, silver (Ag) or alloys thereof, copper (Cu) or alloys thereof, molybdenum (Mo) or alloys thereof, chromium (Cr), tantalum (Ta) and titanium (Ti).

As illustrated in FIGS. 8 and 9, and referring to the processes described in FIGS. 5A-5E, a fourth insulating material layer (indicated at 160), a color filter material layer (indicated at CF), a third insulating material layer (indicated at 150) and a first insulating material layer (indicated at 120) on the data line DL are sequentially etched to expose a portion of the data line DL. Similarly, the fourth insulating material layer, the color filter material layer and the third insulating material layer on a source electrode SE, a drain electrode DE and the gate electrode GE are sequentially etched to expose a portion of the source electrode SE, the drain electrode DE and the gate electrode GE. In addition, the fourth insulating material layer, the color filter material layer, the third insulating material layer and the first insulating material layer on the auxiliary pattern 116 are sequentially etched to expose a portion of the auxiliary pattern 116.

Accordingly, each of a first contact hole CNT1 exposing the data line DL, second and third contact holes CNT2 and CNT3 exposing the source electrode SE and the drain electrode DE, a fourth contact hole CNT4 exposing the gate electrode GE and a fifth contact hole CNT5 exposing the auxiliary pattern 116 is defined by such etching.

That is, the forming of the contact holes CNT1, CNT2, CNT3, CNT4 and CNT5 forms the fourth insulating layer 160, the color filter CF, the third insulating layer 150 and the first insulating layer 120 which are patterned using a single mask.

A pixel electrode PE is formed on the fourth insulating layer 160 at a pixel area PA (refer to FIG. 1), and a first bridge electrode BE1, the second bridge electrode BE2 and a connection electrode CNE which extends from the pixel electrode PE are disposed or formed on the fourth insulating layer 160 at the first light blocking area BA1.

The first bridge electrode BE1 is connected to the data line DL at and through the first contact hole CNT1 and is connected to the source electrode SE at and through the second contact hole CNT2.

The connection electrode CNE is connected to the drain electrode DE at and through the third contact hole CNT3.

The second bridge electrode BE2 is connected to the gate electrode GE at and through the fourth contact hole CNT4 and is connected to the auxiliary pattern 116 at and through the fifth contact hole CNT5.

In an exemplary embodiment of manufacturing the display panel and/or the display device, the pixel electrode PE, the first and second bridge electrodes BE1 and BE2 and the connection electrode CNE may be simultaneously formed in a substantially same process. That is, the pixel electrode PE, the connection electrode CNE, the first bridge electrode BE1 and the second bridge electrode BE2 may be in a same layer of the lower panel 100 among layers disposed on the lower substrate 110 to be formed from a same material layer and each include the same material.

The auxiliary pattern 116 receives a gate voltage through the second bridge electrode BE2 connected to the gate electrode GE.

Accordingly, in a cross-sectional thickness (third) direction (vertical in FIGS. 8 and 9), the auxiliary pattern 116 to which the gate voltage is applied is located below the semiconductor layer SM and the gate electrode GE to which the gate voltage is applied is located above the semiconductor layer SM. Accordingly, electrons may smoothly move through a back channel of the semiconductor layer SM as well as a front channel of the semiconductor layer SM, thereby improving an electric current which flows at the thin film transistor ("TFT"). In addition, in an off state, the mobility of electrons in the channel area of the semiconductor layer SM of the thin film transistor ("TFT") is reduced, and thus off electrical current is reduced and the control of a threshold voltage is facilitated.

As set forth hereinabove, according to one or more exemplary embodiments, since the data line and the first and second shielding lines are in a substantially same layer of a display panel, the display device including such display panel may be manufactured through a relatively few number of mask processes and have a great aperture ratio.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments may be mixed and matched in any manner, to produce further embodiments consistent with the invention.

What is claimed is:
1. A display device comprising:
a display panel which displays an image with light, the display panel comprising:
a substrate comprising:
a first light blocking area lengthwise extending in a first direction,
a second light blocking area lengthwise extending in a second direction intersecting the first direction, and
a pixel area at which the image is displayed, the pixel area defined by the first light blocking area and the second light blocking area which intersect each other;
a first shielding line and a second shielding line spaced apart from each other on the substrate at the first light blocking area;
a data line between the first shielding line and the second shielding line at the first light blocking area, the data line spaced apart from the first shielding line and the second shielding line;
a gate line disposed on the substrate at the second light blocking area, the gate line intersecting the data line; and
a thin film transistor connected to the data line and the gate line,
wherein
the first shielding line comprises a first protrusion protruding toward the second shielding line, and the second shielding line comprises a second protrusion protruding toward the first shielding line,
the first protrusion or the second protrusion is overlapped by the thin film transistor, and
the first shielding line and the second shielding line are disposed in a same layer of the display panel as the data line among layers disposed on the substrate of the display panel.

2. The display device as claimed in claim 1, wherein the data line comprises at least one bent portion.

3. The display device as claimed in claim 2, wherein
the gate line is provided in plurality, and
in the first light blocking area, the thin film transistor is provided in plurality respectively connected to a corresponding gate line among the plurality thereof and to the data line,
wherein
the thin film transistors comprise a first thin film transistor and a second thin film transistor,
the first protrusion of the first shielding line and the second protrusion of the second shielding line oppose each other in the first direction with respect to the bent portion of the data line, and
the first thin film transistor overlaps the first protrusion of the first shielding line and the second thin film transistor overlaps the second protrusion of the second shielding line.

4. The display device as claimed in claim 1, further comprising:
a first insulating layer on the data line and on the first and second shielding lines;
a semiconductor layer pattern of the thin film transistor on the first insulating layer, the semiconductor layer pattern disposed to overlap the data line and the respective overlapped first or second protrusion;
a second insulating layer on the semiconductor layer pattern;
a gate electrode of the thin film transistor, on the second insulating layer;
a third insulating layer on the first insulating layer, the semiconductor layer pattern and the gate electrode;
a color filter on the third insulating layer;
a fourth insulating layer on the color filter;
a pixel electrode on the fourth insulating layer at the pixel area; and
a first bridge electrode on the fourth insulating layer at the first light blocking area.

5. The display device as claimed in claim 4, wherein the semiconductor layer pattern comprises at least one selected from zinc oxide, zinc-tin oxide, zinc-indium oxide, indium oxide, titanium oxide, indium-gallium-zinc oxide and indium-zinc-tin oxide.

6. The display device as claimed in claim 4, wherein the first bridge electrode is disposed in a same layer of the display panel as the pixel electrode among layers disposed on the substrate of the display panel.

7. The display device as claimed in claim 4, wherein the first bridge electrode is extended through:
the first insulating layer, the third insulating layer, the color filter and the fourth insulating layer to be connected to the data line, and
the third insulating layer, the color filter and the fourth insulating layer to be connected to the semiconductor layer pattern of the thin film transistor.

8. The display device as claimed in claim 4, wherein the pixel electrode is extended through the third insulating layer, the color filter and the fourth insulating layer to be connected to the semiconductor layer pattern of the thin film transistor.

9. The display device as claimed in claim 4, further comprising an auxiliary pattern on the substrate at the first light blocking area, the auxiliary pattern overlapped by the gate electrode of the thin film transistor.

10. The display device as claimed in claim 9, wherein the auxiliary pattern is disposed in a same layer of the display panel as the first and second shielding lines and the data line among layers disposed on the substrate of the display panel.

11. The display device as claimed in claim 9, further comprising a second bridge electrode disposed on the fourth insulating layer at the first light blocking area, the second bridge electrode overlapping the auxiliary pattern and the gate electrode.

12. The display device as claimed in claim 11, wherein the second bridge electrode is disposed in a same layer of the display panel as the first bridge electrode and the pixel electrode among layers disposed on the substrate of the display panel.

13. The display device as claimed in claim 11, wherein the second bridge electrode extends through:
the third insulating layer, the color filter and the fourth insulating layer to be connected to the gate electrode of the thin film transistor, and
the first insulating layer, the third insulating layer, the color filter and the fourth insulating layer to be connected to the auxiliary pattern.

14. The display device as claimed in claim 4, wherein a length of the pixel electrode in the second direction is larger than a width of the pixel electrode in the first direction.

15. The display device as claimed in claim 1, further comprising a black matrix at the first light blocking area and the second light blocking area.

16. A method of manufacturing a display device, comprising:
preparing a display panel which displays an image with light, comprising:
providing a substrate including a first light blocking area lengthwise extending in a first direction, a second light blocking area lengthwise extending in a second direction intersecting the first direction, and a pixel area at which the image is displayed, the pixel area defined by the first light blocking area and the second light blocking area which intersect each other,
providing a first light shielding line and a data line in a same layer on the substrate of the display panel, at the first light blocking area,
providing a gate line on the substrate at the second light blocking area, the gate line intersecting the data line; and
providing a first thin film transistor in the first light blocking area, the first thin film transistor connected to the data line and the gate line,
wherein in the first light blocking area,
the first shielding line comprises a first protrusion protruding toward the data line, and
the first protrusion of the first shielding line is overlapped by the first thin film transistor.

17. The method as claimed in claim 16, wherein
the providing the data line comprises providing the data line having a bent portion, and
the providing the gate line comprises providing the gate line in plurality at the second light blocking area,
further comprising, at the first light blocking area:
providing a second light shielding line in a same layer on the substrate of the display panel as the first light shielding line and the data line, the second light shielding line opposing the first light shielding line in the second direction with respect to the data line, and
providing a second thin film transistor connected to the data line and a corresponding gate line, wherein the second light shielding line comprises a second protrusion protruding toward the data line, such second protrusion overlapped by the second thin film transistor.

* * * * *